United States Patent [19]
Martin

[11] Patent Number: 5,970,429
[45] Date of Patent: Oct. 19, 1999

[54] METHOD AND APPARATUS FOR MEASURING ELECTRICAL NOISE IN DEVICES

[75] Inventor: Samuel Suresh Martin, Gillette, N.J.

[73] Assignee: Lucent Technologies, Inc., Murray Hill, N.J.

[21] Appl. No.: 08/907,760

[22] Filed: Aug. 8, 1997

[51] Int. Cl.[6] .................................................. G01R 29/26
[52] U.S. Cl. .............................. 702/65; 702/57; 324/613
[58] Field of Search .................................. 702/57, 65, 69, 702/77; 324/754, 768, 769, 600, 613

[56] References Cited

U.S. PATENT DOCUMENTS

| | | | |
|---|---|---|---|
| 4,908,570 | 3/1990 | Gupta et al. | 324/158 T |
| 5,049,811 | 9/1991 | Dreyer et al. | 324/158 R |
| 5,057,441 | 10/1991 | Gutt et al. | 437/8 |
| 5,648,275 | 7/1997 | Smayling et al. | 437/8 |
| 5,798,649 | 8/1998 | Smayling et al. | 324/551 |

OTHER PUBLICATIONS

Berkeley Technology Associates "NoisePro" and "BTA9603" Product Brochure—pp. 2–4 in particular.(Dec. 1996).

Luo, "Measurement and Extraction for Parameters of Noise in Bipolar Transistors Based on Measuring the Power Spectral Density of Noise Current", IEEE, 1993.

Macucci et al., "Very Sensitive Measurement Method of Electron Device Current Noise", IEEE, 1991.

Chaar et al., "Low–Frequency Noise Measurements on Semiconductor Devices Using a Probe Station", IEEE, 1994.

*Primary Examiner*—Patrick Assouad

[57] ABSTRACT

A method and apparatus for measuring electrical noise in devices is disclosed that comprises two distinct measurement phases. In one phase, the differential output resistance, $r_{ab}$, between a first terminal, a, and a second terminal, b, of the device under test is measured. In the second phase, a voltage, $V_L(t)$, is measured across a load resistance, $R_L$, that is in series with the first terminal, a, of the device under test. Then the output voltage noise spectral density, $S_{VL}$, is determined based on a fourier transform of the voltage, $V_L(t)$; and the output current noise spectral density, $S_{ia}$, is determined based on the output voltage noise spectral density, $S_{VL}$, the load resistance, $R_L$, and the differential output resistance, $r_{ab}$.

12 Claims, 4 Drawing Sheets

METHOD AND APPARATUS FOR MEASURING ELECTRICAL NOISE IN DEVICES

FIELD OF THE INVENTION

The present invention relates to electrical and electronic devices in general, and, more particularly, to a method and apparatus for measuring electrical noise in those devices.

BACKGROUND OF THE INVENTION

Typically, the performance of an electronic system is limited by the quantity of noise exhibited by its components. For example, the performance of a wireless telecommunications terminal is typically limited by the quantity of phase noise produced by its oscillator.

Although a crystal oscillator typically exhibits little phase noise, it cannot be easily fabricated as a component of an integrated circuit. In contrast, an oscillator that is fabricated from semiconductor devices in an integrated circuit typically exhibits more phase noise than does a crystal oscillator.

Although there are several types of noise exhibited by a semiconductor device (e.g., thermal noise, shot noise, flicker noise, etc.), empirically, the largest contributing factor to phase noise in a circuit is flicker noise, which is also known as "1/f" noise because the output current noise spectral density of flicker noise varies inversely with frequency.

Empirically, the quantity of flicker noise exhibited by a device is affected by the process used to fabricate the device. Therefore, a semiconductor manufacturer can affect the quantity of flicker noise exhibited by the devices it fabricates by carefully measuring the flicker noise exhibited by the devices emanating from a fabrication line and by modifying the fabrication line process in response to the measured results. There are several techniques in the prior art for measuring, or attempting to measure, the flicker noise exhibited by a device.

FIG. 1 depicts a schematic diagram of an elementary technique in the prior art for measuring the flicker noise exhibited by a device, which in FIG. 1 is a MOSFET. In accordance with this technique an A/D converter directly measures the voltage, V(t), across two terminals of the MOSFET which has been biased with a steady DC voltage. The output of the A/D converter is then fed into a spectrum analyzer, which computes the output voltage noise spectral density, $S_{VL}$, for the MOSFET based on the temporal variations in V(t). Typically, this technique does not yield a satisfactory result because the noise within the A/D converter usually exceeds, and therefore masks, the flicker noise in the device under test.

FIG. 2 depicts a schematic diagram of a second technique in the prior art for measuring the flicker noise exhibited by a device. In accordance with this technique, a low-noise amplifier in interposed between the device under test and the A/D converter to amplify the flicker noise with respect to the noise in the A/D converter. Typically, this approach does not yield a satisfactory result when the device under test is a semiconductor device. The reason is that the noise figure of the amplifier depends on matching the impedance of the device under test to the input impedance of the amplifier. This is particularly difficult to accomplish when the device under test has a variable, non-linear impedance as do semiconductor devices.

FIG. 3 depicts a schematic diagram of a third technique in the prior art for measuring flicker noise. In accordance with this technique, the noise exhibited by the device under test is measured indirectly by measuring the output voltage noise spectral density, $S_{VL}$, in a low-noise load resistor, $R_L$, that is in series with one terminal of the device under test. Because the load resistor and at least one terminal of the device under test are in series, the output current noise spectral density, $S_{ia}$, manifested by the device under test is observable in the voltage fluctuations across the load resistor, assuming that the load resistor exhibits substantially less noise than does the device under test. In accordance with the third technique, the output current noise spectral density, $S_{ia}$, is based on $$S_{VL}\left[\frac{1}{R_L}\right]^2.$$

Preferably, the load resistor is a low-noise resistor, such as a wire-wound resistor, which has an impedance that is fixed and matched to the input impedance of the amplifier. When the DC bias and $V_{IN}$ are provided by batteries, this technique typically provides satisfactory results for low cut-off frequency MOSFETs. For the purposes of this specification, the "cut-off frequency" of a device is the highest frequency of operation at which the gain of the device equals or exceeds one.

Empirically, this technique usually does not provide a satisfactory measurement of the flicker noise in high cut-off frequency MOSFETs or in bipolar devices. Furthermore, because the technique requires batteries to power and bias the device under test, the technique is generally not amenable for use in an industrial environment such as a fabrication line.

FIG. 4 depicts a schematic diagram of a fourth technique in the prior art for measuring flicker noise. The addition of the RC filter on all of the leads to the device under test enables the device under test to be powered with a conventional power supply in contrast to requiring a battery supply and is, therefore, more suitable for use in an industrial setting. Like the technique in FIG. 3, however, this technique generally provides satisfactory results for low cut-off frequency MOSFETs but not for high cut-off frequency MOSFETs or bipolar devices.

FIG. 5 depicts a schematic diagram of a fifth technique in the prior art for measuring flicker noise. In accordance with this technique, a switch selects from one of a number of load resistors, $R_1, R_2, \ldots R_n$, in an attempt to match the load resistance to the resistance between the drain and source or the collector and emitter of the device under test. This is advantageous because it increases the sensitivity of the technique to measure flicker noise. Empirically, the presence of the switch in the circuit adds noise, which substantially offsets the gain in sensitivity that is attained from matching the load resistance to the resistance of the device under test. Like the techniques depicted in FIGS. 3 and 4, this technique generally provides satisfactory results for low cut-off frequency MOSFETs but does not for high cut-off frequency MOSFETs or bipolar devices.

Although techniques exist for measuring the flicker noise in low cut-off frequency MOSFETs in an industrial setting, there exists the need for a tool that can accurately measure in an industrial setting the flicker noise exhibited by bipolar devices and both low and high cut-off frequency MOS devices, including transistors and diodes.

SUMMARY OF THE INVENTION

Some embodiments of the present invention are capable of measuring the noise of a device under test without the restrictions and disadvantages of techniques in the prior art. In particular, some embodiments of the present invention are capable of measuring the flicker noise exhibited by both low cut-off frequency and high cut-off frequency MOS and bipolar devices. Furthermore, some embodiments of the present invention are capable of measuring the flicker noise of a device under test in an industrial environment while the device under test is still a part of a semiconductor wafer.

These advantages may be found in some embodiments of the present invention that comprise two distinct measurement phases. In one phase, the differential output resistance, $r_{ab}$, between a first terminal, a, and a second terminal, b, of a device is measured. In the second phase, a voltage, $V_L(t)$, is measured across a load resistance, $R_L$, that is in series with the first terminal, a, of the device. Then the output voltage noise spectral density, $S_{VL}$, is determined based on a fourier transform of the voltage, $V_L(t)$, and the output current noise spectral density, $S_{ia}$, is determined based on the output voltage noise spectral density, $S_{VL}$, the load resistance, $R_L$, and the differential output resistance, $r_{ab}$.

DETAILED DESCRIPTION

Figure 1:
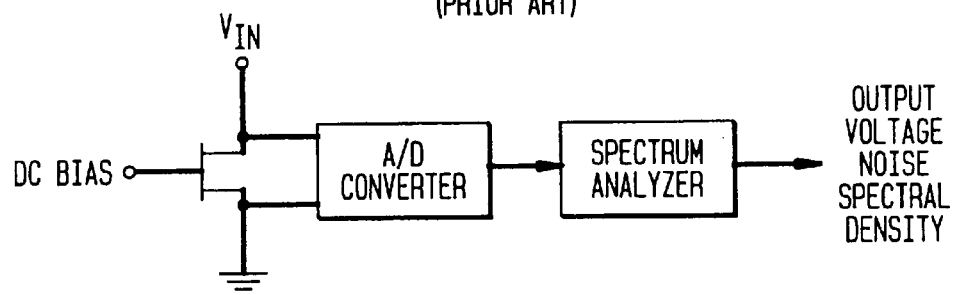
FIG. 1 depicts a schematic diagram of an elementary technique in the prior art for measuring the flicker noise exhibited by a device.
Figure 2:
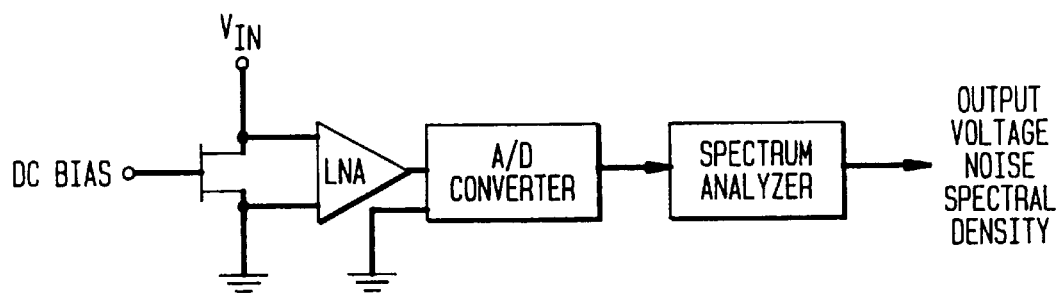
FIG. 2 depicts a schematic diagram of a second technique in the prior art for measuring the flicker noise exhibited by a device.
Figure 3:
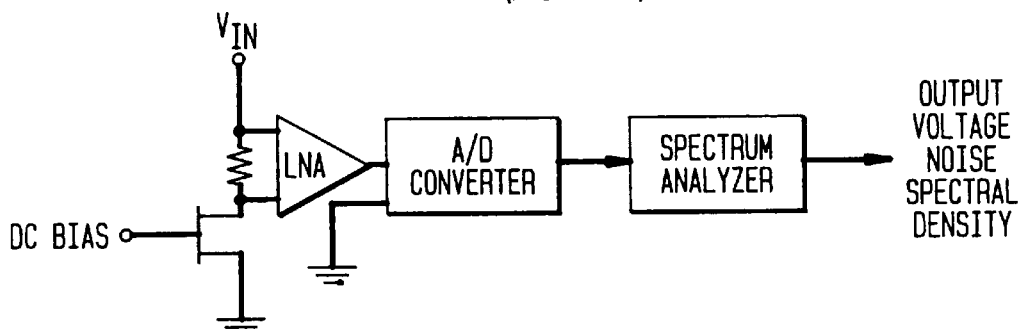
FIG. 3 depicts a schematic diagram of a third technique in the prior art for measuring flicker noise.
Figure 4:
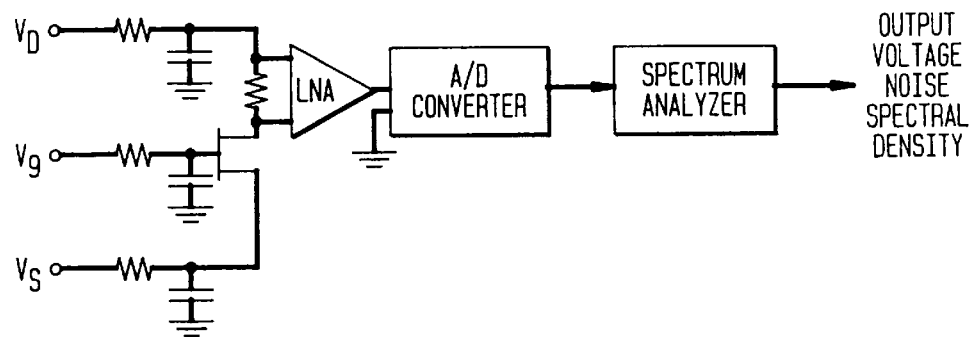
FIG. 4 depicts a schematic diagram of a fourth technique in the prior art for measuring flicker noise.
Figure 5:
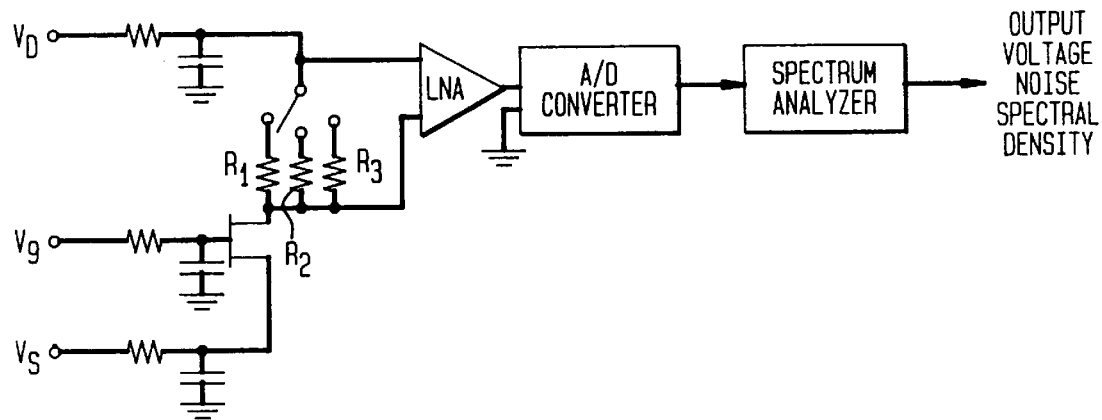
FIG. 5 depicts a schematic diagram of a fifth technique in the prior art for measuring flicker noise.
Figure 6:
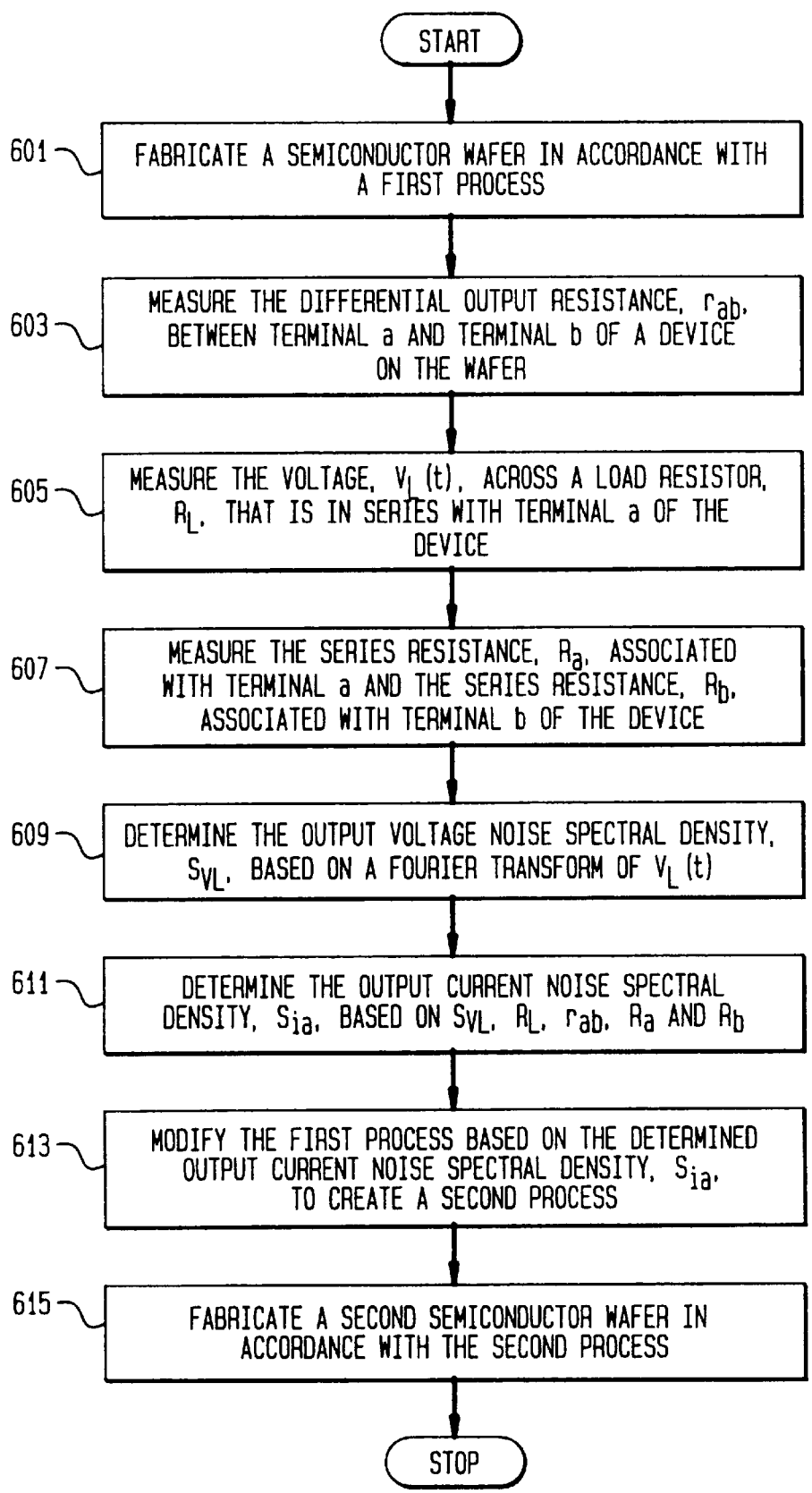
FIG. 6 depicts a flowchart of the steps associated with the illustrative embodiment of the present invention.

FIG. 6 depicts a flowchart of the steps associated with the illustrative embodiment of the present invention, which measures the output current noise spectral density, $S_{ia}$, of a device under test.

At step 601, a semiconductor wafer is fabricated in accordance with a first process, in well-known fashion.

At step 603, the differential output resistance, $r_{ab}$, is measured between two terminals, terminal a and terminal b, of a device on the wafer while the device is biased, if necessary, in the region of interest. Advantageously, this can be done while the device is still a part of the wafer and while the wafer is still in the fabrication facility.

When the device is a diode, the differential output resistance, $r_{ab}$, should be measured while the device is biased in the region in which the measurement of the output current noise spectral density, $S_{ia}$, is desired. When the device is a transistor, the differential output resistance, $r_{ab}$, should be measured from the source to the drain or from the collector to the emitter while the device is biased in the region in which the measurement of the output current noise spectral density, $S_{ia}$, is desired.

Figure 7:
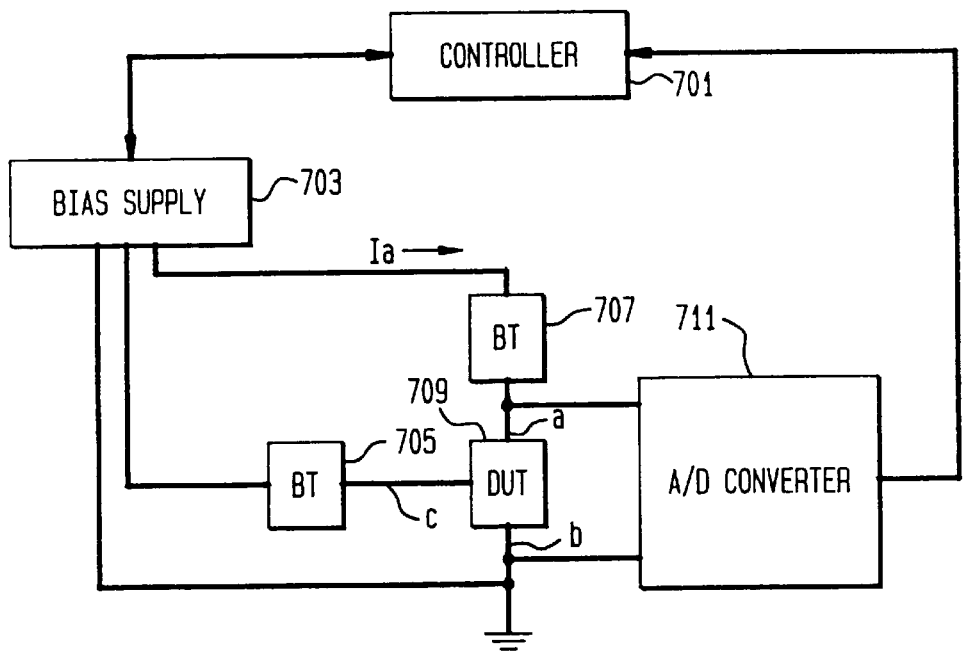
FIG. 7 depicts a block diagram of an illustrative apparatus for performing one measurement phase of the illustrative embodiment.

FIG. 7 depicts a block diagram of an illustrative apparatus for performing step 603. The illustrative apparatus advantageously comprises: controller 701, bias supply 703, bias tee 705, bias tee 707 and A/D converter 711, in addition to device under test 709. Controller 701 is advantageously an appropriately programmed general-purpose computer with associated RAM, ROM and I/O that is capable of directing bias supply 703 to bias each terminal of device under test 709 and to receive from bias supply 703 a measure of the current $I_a$. Voltmeter 711 advantageously measures the voltage, $V_{ab}$, across terminal a and terminal b of device under test 709 and provides the result to controller 701. Controller 701 is advantageously capable of receiving $V_{ab}$ and $I_a$ to calculate the differential output resistance, $r_{ab}$, in well-known fashion.

Advantageously, bias tee 705 and bias tee 707 are connected to the non-grounded leads of device under test 709 to inhibit any tendency of the device to self-oscillate while the differential output resistance, $r_{ab}$, is measured. Furthermore, for high cut-off frequency MOS and bipolar devices, ground-signal-ground probes are preferably used to probe the device under test.

Figure 8:
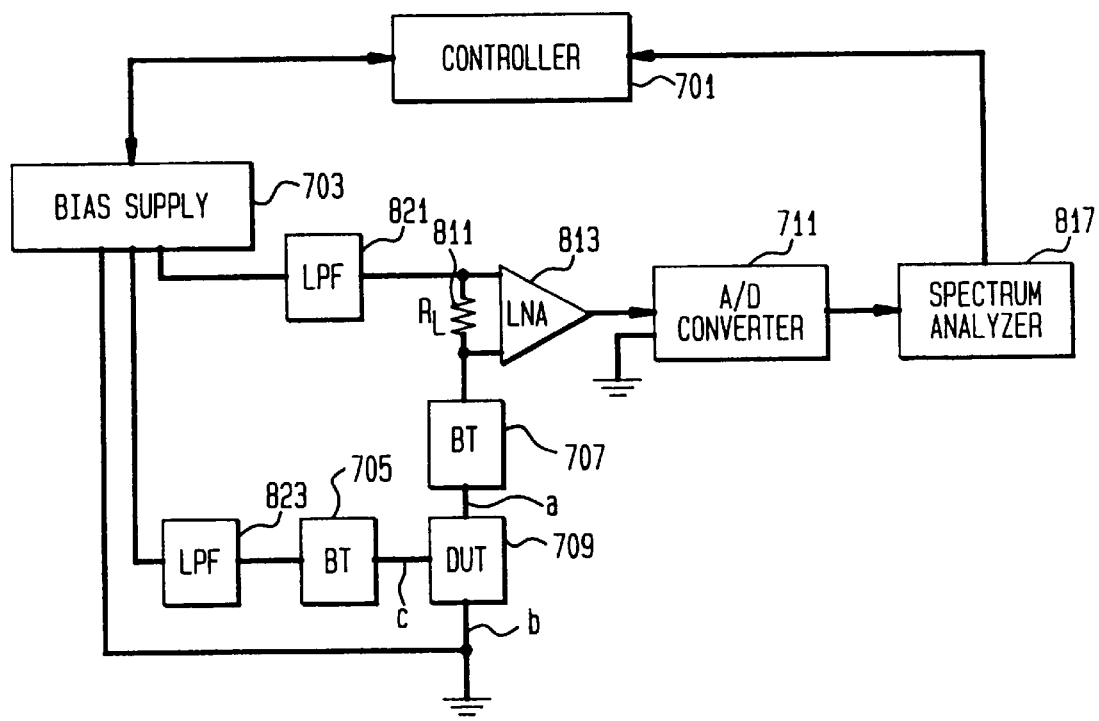
FIG. 8 depicts a block diagram of an illustrative apparatus for performing a second measurement phase of the illustrative embodiment.

At step 605, a low-noise load resistor, $R_L$, is connected in series with terminal a of the device under test. FIG. 8 depicts a block diagram of an illustrative apparatus for performing steps 605 and 609 through 613 of the illustrative embodiment. The illustrative apparatus of FIG. 8 advantageously comprises: controller 701, bias supply 703, bias tee 705, bias tee 707, device under test 709, A/D converter 711, low-pass filter 821, low-pass filter 823, load resistor 811, low-noise amplifier 813 and spectrum analyzer 817.

Controller 701 is advantageously capable of directing bias supply 703 to bias device under test 709 precisely as it was biased in step 603. Low-pass filter 821 advantageously has a cut-off frequency of 1 Hz or less and is interposed between bias supply 703 and load resistor 811 to inhibit any potential voltage oscillations from bias supply 703 from being seen in load resistor 821. Analogously, low-pass filter 823 advantageously has a cut-off frequency of 1 Hz or less and is interposed between bias supply 703 and bias tee 705 to inhibit any potential voltage oscillations from bias supply 703 from altering the bias of device under test 709.

Load resistor 811 is advantageously a low-noise resistor, such as wire-wound resistor, with resistance, $R_L$, and is placed in series with terminal a of the device under test. Advantageously, $R_L$ has a value of close to $r_{ab}$ so as to increases the sensitivity of the apparatus to measure flicker noise.

Low-noise amplifier 813 is advantageously a low-noise amplifier with an input impedance that matches the impedance of $R_L$. Voltmeter 711 advantageously measures the amplified voltage from low-noise amplifier 813 and feeds the measure to spectrum analyzer 817. Spectrum analyzer 817 advantageously is capable of performing a fourier transform on the output of A/D converter 711 and feeding the result to controller 701. The front-end of spectrum analyzer 817 advantageously has a high-Q bandpass filter with an alterable passband that permits spectrum analyzer to analyze only a frequency decade or so at a time. For example, during one sample measurement the bandpass filter has a passband of from 100 Hz to 1000 Hz and during a second sample measurement the bandpass filter has a passband of from 1000 Hz to 10,000 Hz. As is well-known to those skilled in signal-processing, the presence of the bandpass filter helps to sharpen the output of spectrum analyzer 817 for the frequency range of interest.

Steps are advantageously taken to inhibit the amount of noise coupled into the device under test by the test equipment. The principal causes of external noise are: (1) ground loop currents, and (2) inductive coupling. Although the noise caused by ground loop currents is militated by more ground nodes, the noise caused by inductive coupling is mitigated by more ground nodes. Ground-loop currents can be avoided by using a single ground node. However, in wafer-probed environments this increases the likelihood of inductively coupled noise. Therefore, there is an inherent trade-off between the amount of noise inductively coupled into the device under test and the noise caused by ground-loop currents in the system. Advantageously, bias supply 703, low-pass filter 821, low-pass filter 823, bias tee 705, bias tee 707, terminal b of device under test 709 and low-noise amplifier 813 have a common ground. It has been observed that this number and selection of ground nodes couples the least amount of noise into the device under test.

Returning to step 605 in FIG. 6, A/D converter 711 measures the voltage, $V_L(t)$, across the load resistor while the device under test is biased the same as it was in step 603.

At step 607, the series resistance associated with terminal a, $R_a$, and the series resistance associated with terminal b, $R_b$, are determined or measured in well-known fashion. For example, when the device under test is a MOSFET and terminal a is the MOSFET's drain, $R_a$ is the series resistance associated with the diffused drain region, which will be known to those skilled in the art based on the process used to make the device under test. For some devices under test, such as a resistor, $R_a$ and $R_b$ will have a value of 0 Ω. It will be clear to those skilled in the art how to determine the value of $R_a$ and $R_b$.

At step 609, the output of A/D converter 711, $V_L(t)$, is fed into spectrum analyzer 817, which outputs the output voltage noise spectral density, $S_{VL}$, for the load resistor, $R_L$, in well-known fashion.

At step 611, controller 701 receives the output voltage noise spectral density, $S_{VL}$, and determines the output current noise spectral density, $S_{ia}$, for the device under test. Advantageously, controller 701 determines the output current noise spectral density, $S_{ia}$, based on $S_{VL}$, $r_{ab}$, $R_a$, $R_b$ and $R_L$. In particular:

$$S_{ia} = S_{VL}\left[1 + \frac{R_a + R_b}{R_L}\right]^2 \left[\frac{1}{r_{ab}} + \frac{1}{R_a + R_b + R_L}\right]^2 \quad \text{(Eq. 1)}$$

When $r_{ab} \approx R_L \gg R_a + R_b$, then Eq. 1 can, for many cases, be simplified so that the output current noise spectral density, $S_{ia}$, is based on $S_{VL}$, $r_{ab}$ and $R_L$. In particular:

$$S_{ia} = S_{VL}\left[\frac{1}{r_{ab}} + \frac{1}{R_L}\right]^2 \quad \text{(Eq. 2)}$$

When $r_{ab} \gg R_L \gg R_a + R_b$, then Eq. 1 can, for many cases, be simplified so that the output current noise spectral density, $S_{ia}$, is based on $S_{VL}$ and $R_L$. In particular:

$$S_{ia} = S_{VL}\left[\frac{1}{R_L}\right]^2 \quad \text{(Eq. 3)}$$

It will be clear to those skilled in the art when Eq. 2 or 3 yields satisfactory results and when Eq. 1 should be used. Advantageously, several rounds of steps 603 and 607 through 611 are performed, each time varying a parameter of the bias of the device under test so that $S_{ia}$ vs. $V_c$, $S_{ia}$ vs. $V_{ab}$, $S_{ia}$ vs. $I_a$ and $S_{ia}$ v. $I_c$, $S_{ia}$ v. f curves can be traced. It will be clear to those skilled in the art how to perform step 611 for various parameters.

At step 613, the output current noise spectral density measurements calculated in step 611 are advantageously correlated to each of parameters of the first process (e.g., a dopant density, etc.) and to the parameters of earlier processes, if the data is available, so that the first process can be modified, if necessary, to create a second process for making wafers with devices that have a lower output current noise spectral density, $S_{ia}$. It will be clear to those skilled in the art how to correlate the output current noise spectral density measurements calculated in step 611 to the first process parameters and to the parameters of earlier processes. It will also be clear to those skilled in the art how to modify the first process based on the output current noise spectral density measurements to create a second process based, at least in part, on the results of step 611.

At step 615, a semiconductor wafer is fabricated in accordance with a second process, in well-known fashion, to produce a semiconductor wafer comprising a device with a lower output current noise spectral density, $S_{ia}$, than the wafer fabricated in step 611.

It is to be understood that the above-described embodiments are merely illustrative of the invention and that many variations may be devised by those skilled in the art without departing from the scope of the invention. It is therefore intended that such variations be included within the scope of the following claims.

What is claimed is:

1. A method of measuring an output current noise spectral density, $S_{ia}$, in a device that has at least a first terminal, a, and a second terminal, b, said method comprising the steps of:

measuring a differential output resistance, $r_{ab}$, between said first terminal, a, and said second terminal, b, of said device;

measuring a voltage, $V_L(t)$, across a load resistance, $R_L$, that is in series with said first terminal;

determining an output voltage noise spectral density, $S_{VL}$, based on a fourier transform of said voltage, $V_L(t)$; and determining said output current noise spectral density, $S_{ia}$, based on said output voltage noise spectral density, $S_{VL}$, said load resistance, $R_L$, and said differential output resistance, $r_{ab}$.

2. The method of claim 1 wherein said output current noise spectral density, $S_{ia}$, is based on $$S_{VL}\left[\frac{1}{r_{ab}} + \frac{1}{R_L}\right]^2.$$

3. The method of claim 1 wherein said device has a first series resistance, $R_a$, associated with said first terminal, a, and a second series resistance, $R_b$, associated with said second terminal, b, and wherein said output current noise spectral density, $S_{ia}$, is based on $$S_{VL}\left[1 + \frac{R_a + R_b}{R_L}\right]^2 \left[\frac{1}{r_{ab}} + \frac{1}{R_a + R_b + R_L}\right]^2.$$

4. An apparatus for measuring an output current noise spectral density, $S_{ia}$, in a device that has at least a first terminal, a, and a second terminal, b, said apparatus comprising:

an A/D converter for measuring a differential output resistance, $r_{ab}$, between said first terminal, a, and said second terminal, b, of said device, and for measuring a voltage, $V_L(t)$, across a load resistance, $R_L$, that is in series with said first terminal; and a processor for determining an output voltage noise spectral density, $S_{VL}$, based on a fourier transform of said voltage, $V_L(t)$, and determining said output current noise spectral density, $S_{ia}$, based on said output voltage noise spectral density, $S_{VL}$, said load resistance, $R_L$, and said differential output resistance, $r_{ab}$.

5. The apparatus of claim 4 wherein said output current noise spectral density, $S_{ia}$, is based on $$S_{VL}\left[\frac{1}{r_{ab}} + \frac{1}{R_L}\right]^2.$$

6. The apparatus of claim 4 wherein said device has a first series resistance, $R_a$, associated with said first terminal, a, and a second series resistance, $R_b$, associated with said second terminal, b, and wherein said output current noise spectral density, $S_{ia}$, is based on $$S_{VL}\left[1 + \frac{R_a + R_b}{R_L}\right]^2 \left[\frac{1}{r_{ab}} + \frac{1}{R_a + R_b + R_L}\right]^2.$$

7. A method of quality control for semiconductor wafers by measuring an output current noise spectral density, $S_{ia}$, in a device that has at least a first terminal, a, and a second terminal, b, said method comprising the steps of:

fabricating a first semiconductor wafer containing said device in accordance with a first process;

measuring a differential output resistance, $r_{ab}$, between said first terminal, a, and said second terminal, b, of said device;

measuring a voltage, $V_L(t)$, across a load resistance, $R_L$, that is in series with said first terminal;

determining an output voltage noise spectral density, $S_{VL}$, based on a fourier transform of said voltage, $V_L(t)$;

determining said output current noise spectral density, $S_{ia}$, based on said output voltage noise spectral density, $S_{VL}$, said load resistance, $R_L$, and said differential output resistance, $r_{ab}$;

modifying said first process based on said output current noise spectral density, $S_{ia}$, to create a second process; and fabricating said second semiconductor wafer in accordance with said second process.

8. The method of claim 7 wherein said output current noise spectral density, $S_{ia}$, is based on $$S_{VL}\left[\frac{1}{r_{ab}} + \frac{1}{R_L}\right]^2.$$

9. The method of claim 7 wherein said device has a first series resistance, $R_a$, associated with said first terminal, a, and a second series resistance, $R_b$, associated with said second terminal, b, and wherein said output current noise spectral density, $S_{ia}$, is based on $$S_{VL}\left[1 + \frac{R_a + R_b}{R_L}\right]^2 \left[\frac{1}{r_{ab}} + \frac{1}{R_a + R_b + R_L}\right]^2.$$

10. An apparatus that measures an output current noise spectral density, $S_{ia}$, in a device that has at least a first terminal, a, and a second terminal, b, said apparatus comprising:

means for measuring a differential output resistance, $r_{ab}$, between said first terminal, a, and said second terminal, b, of said device;

means for measuring a voltage, $V_L(t)$, across a load resistance, $R_L$, that is in series with said first terminal;

means for determining an output voltage noise spectral density, $S_{VL}$, based on a fourier transform of said voltage, $V_L(t)$; and means for determining said output current noise spectral density, $S_{ia}$, based on said output voltage noise spectral density, $S_{VL}$, said load resistance, $R_L$, and said differential output resistance, $r_{ab}$.

11. The apparatus of claim 10 wherein said output current noise spectral density, $S_{ia}$, is based on $$S_{VL}\left[\frac{1}{r_{ab}} + \frac{1}{R_L}\right]^2.$$

12. The apparatus of claim 10 wherein said device has a first series resistance, $R_a$, associated with said first terminal, a, and a second series resistance, $R_b$, associated with said second terminal, b, and wherein said output current noise spectral density, $S_{ia}$, is based on $$S_{VL}\left[1 + \frac{R_a + R_b}{R_L}\right]^2 \left[\frac{1}{r_{ab}} + \frac{1}{R_a + R_b + R_L}\right]^2.$$

* * * * *